United States Patent [19]
Tanaka et al.

[11] Patent Number: 5,061,356
[45] Date of Patent: Oct. 29, 1991

[54] VACUUM TREATMENT APPARATUS AND VACUUM TREATMENT METHOD

[75] Inventors: Shigeru Tanaka; Eiji Setoyama; Shinzou Oikawa, all of Hitachi; Sigeki Yamamura, Katsuta, all of Japan

[73] Assignee: Hitachi, Ltd., Tokyo, Japan

[21] Appl. No.: 485,526

[22] Filed: Feb. 27, 1990

[30] Foreign Application Priority Data

Feb. 28, 1989 [JP] Japan .................................. 01-05299

[51] Int. Cl.$^5$ .............................................. C23C 14/00
[52] U.S. Cl. ............................ 204/192.12; 204/298.26; 118/730
[58] Field of Search ...................... 204/192.12, 296.26; 118/730

[56] References Cited

U.S. PATENT DOCUMENTS

| | | | |
|---|---|---|---|
| 3,785,853 | 1/1974 | Kirkman et al. | 118/730 |
| 4,226,208 | 10/1980 | Nishida et al. | 118/730 |
| 4,583,488 | 4/1986 | Brown et al. | 118/730 |

FOREIGN PATENT DOCUMENTS

1369713  9/1963  France .

Primary Examiner—John F. Niebling
Assistant Examiner—Steven P. Marquis
Attorney, Agent, or Firm—Antonelli, Terry Stout & Kraus

[57] ABSTRACT

A vacuum treatment apparatus includes a vacuum chamber having a first treatment position and at least one second treatment position where a substrate supported on a substrate stage subjected to a vacuum treatment. A drive device is operatively connected to a holding device to drive the same so that the holding device can move the substrate stage between the first and second treatment positions. The drive device is also operable to drive the holding device so that the holding device can rotate the substrate stage about the axis thereof at the first treatment position. A rotating device is provided for rotating the substrate stage about the axis thereof when the substrate stage is disposed at the second treatment position.

10 Claims, 5 Drawing Sheets

VACUUM TREATMENT APPARATUS AND VACUUM TREATMENT METHOD

BACKGROUND OF THE INVENTION

1. Field of Invention

This invention relates to a vacuum treatment apparatus suited for use as a sputtering apparatus or the like, and also to a vacuum treatment method such as a sputtering method.

2. Prior Art

A conventional vacuum treatment apparatus, such as a sputtering apparatus, includes a first sputter electrode mounted within a vacuum housing at a central position thereof, and a plurality of second sputter electrodes mounted within the vacuum housing and arranged on a circle (having its center disposed on the central position of the vacuum housing) in a circumferentially spaced relation to one another. A substrate supported on a substrate stage is moved so that the substrate can be sequentially brought into opposed relation to the sputter electrodes so as to sequentially deposit films on the substrate.

The above conventional technique has a problem that it is difficult to enhance the uniformity of the film deposited on the substrate.

SUMMARY OF THE INVENTION

It is therefore an object of this invention to provide a vacuum treatment apparatus and a vacuum treatment method which can enhance the uniformity of a film deposited on a substrate.

According to one aspect of the present invention, there is provided a vacuum treatment apparatus comprising:

a vacuum housing defining a vacuum chamber and having a first treatment position within the vacuum chamber and at least one second treatment position disposed within the vacuum chamber and spaced from the first treatment position;

a substrate stage provided within the vacuum chamber so as to support at least one substrate thereon;

holding means for holding the substrate stage in a manner to make it movable between the first treatment position and the second treatment position, the holding means being operable to rotate the substrate stage about an axis of the substrate stage when the substrate stage is disposed at the first treatment position;

drive means operatively connected to the holding means for driving the same so that the holding means can move the substrate stage between the first and second treatment positions, the drive means being operable to drive the holding means so that the holding means can rotate the substrate stage about the axis thereof at the first treatment position; and means for rotating the substrate stage about the axis thereof when the substrate stage is disposed at the second treatment position.

According to another aspect of the present invention, there is provided a vacuum treatment method comprising the steps of:

positioning a substrate stage, supporting a substrate thereon, at a first treatment position within a vacuum chamber, and depositing a first film on the substrate while rotating the substrate stage about an axis thereof, the vacuum chamber having a second treatment position spaced from the first treatment position;

rotating the substrate stage about an axis disposed intermediate the first and second treatment positions, so as to move the substrate stage as well as the substrate into the second treatment position; and depositing a second film on the first film formed on the substrate, while rotating the substrate stage about the axis thereof at the second treatment position.

In the present invention, while the substrate stage is rotated about an axis thereof, the film deposition is carried out at each of the vacuum treatment positions where the substrate stage is disposed in opposed relation to a selected one of the sputter electrodes. Therefore, the uniformity in thickness and thickness distribution of the film is enhanced. Further, the first and second vacuum treatment positions are provided within the vacuum housing, and the substrate stage is sequentially moved to the vacuum treatment positions while maintaining the interior of the vacuum housing to vacuum. Therefore, after the substrate stage is moved to a selected treatment position, the deposition can be started immediately, which can increase the rate of the vacuum treatment.

Many other advantages and features of the present invention will become manifest to those versed in the art upon making reference to the detailed description of preferred embodiments and the accompanying drawings.

DESCRIPTION OF THE PREFERRED EMBODIMENTS OF THE INVENTION

Figure 1:
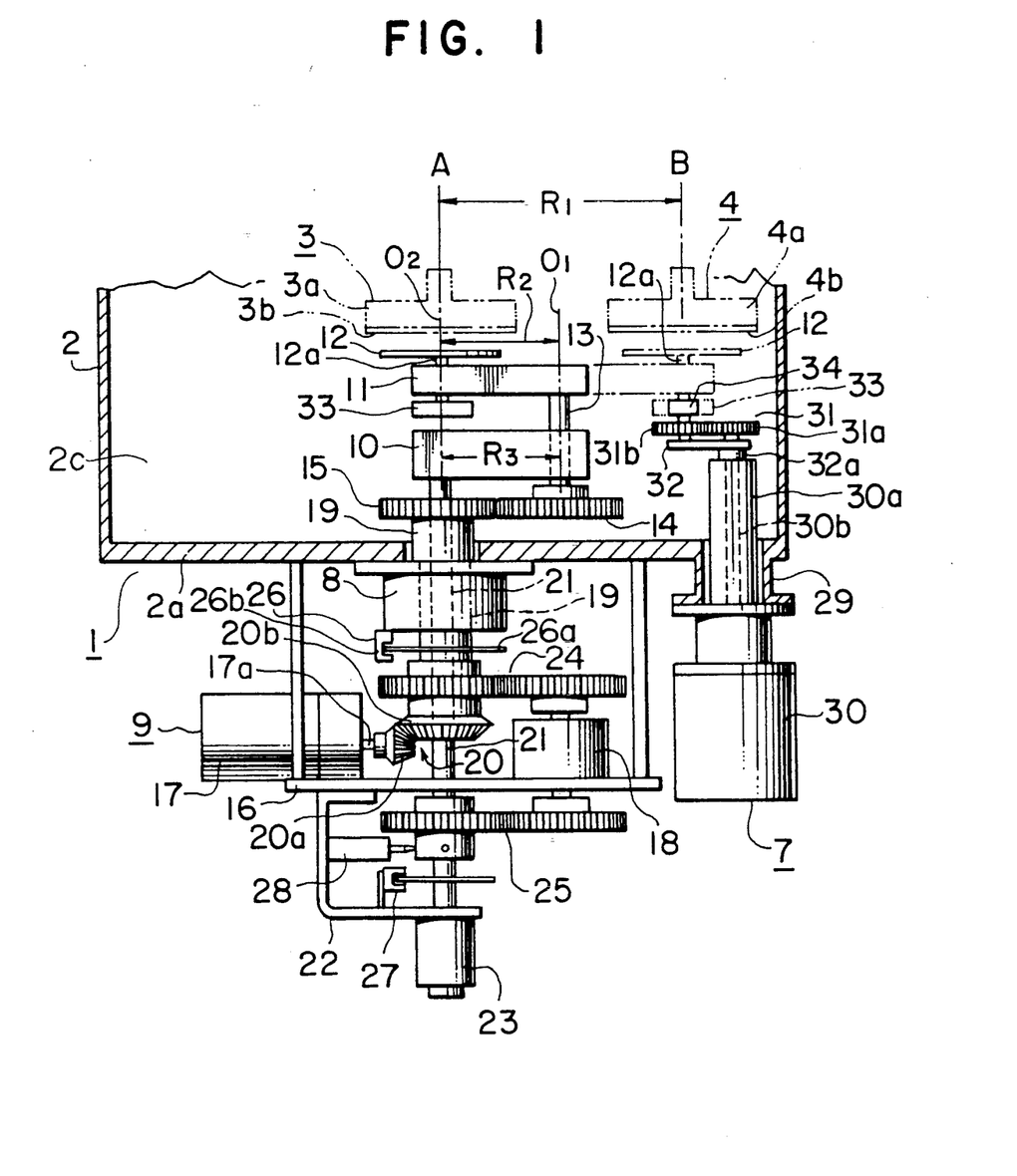
FIG. 1 is a vertical cross-sectional view of a vacuum treatment apparatus according to a first embodiment of the present invention.
Figure 2:
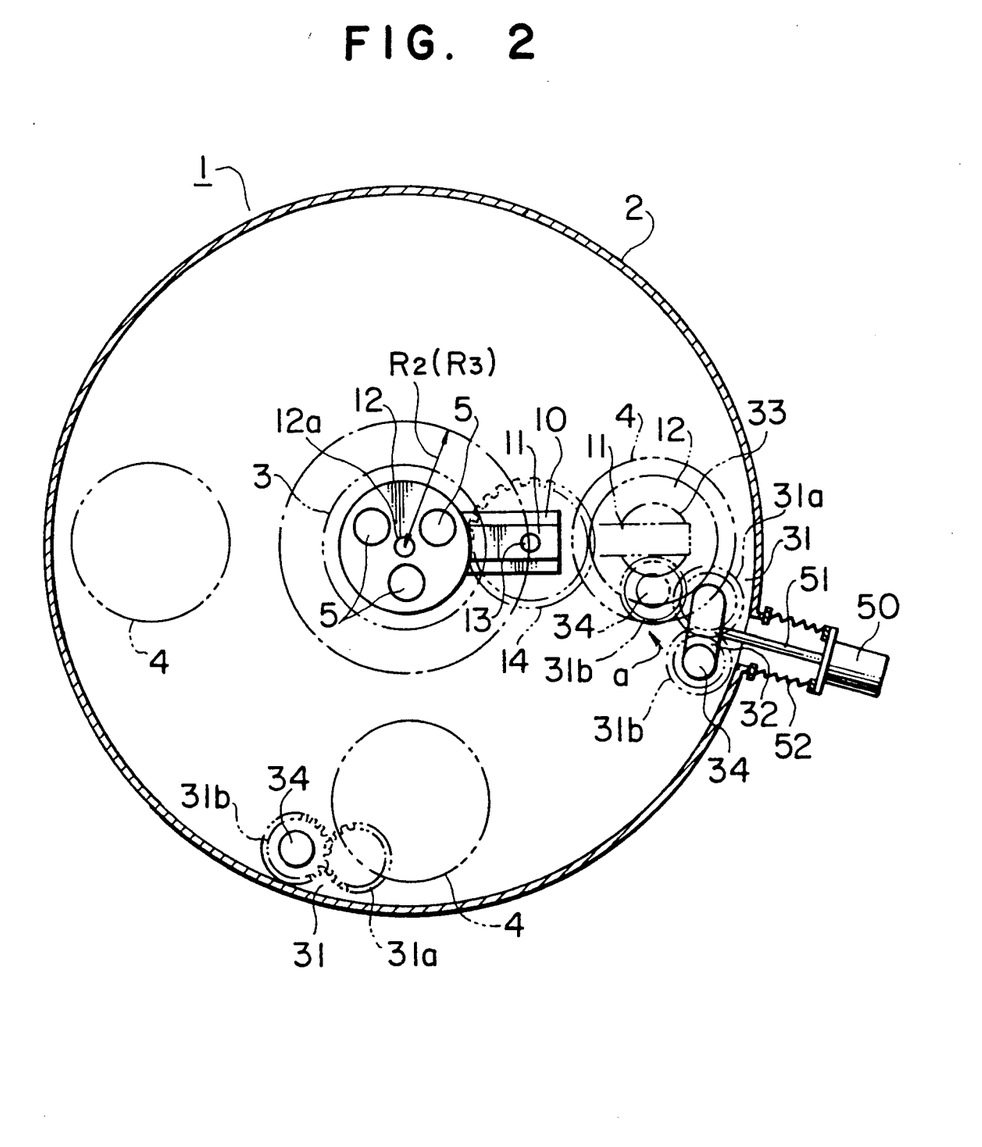
FIG. 2 is a horizontal cross-sectional view of the vacuum treatment apparatus shown in FIG. 1.

Referring now to the drawings wherein like reference numerals are used throughout the various views to designate like parts and, more particularly, to FIGS. 1 and 2, according to these figures, a vacuum treatment apparatus such as, for example, a sputtering apparatus 1 includes treatment sources constituted by sputter electrodes 3 and 4 mounted within a vacuum chamber 2c defined in a vacuum housing 2 in a suspended manner. The sputter electrode 3 comprises a support member 3a and a target material 3b supported by the support member 3a. Similarly, each sputter electrode 4 comprises a support member 4a and a target material 4b supported by the support member 4a. The sputter electrode 3 is arranged in such a manner that its axis or centerline is disposed substantially on a central axis A of the vacuum housing 2. The plurality of sputter electrodes 4 are arranged in such a manner that their axes are disposed on a circle having its center disposed at the central axis A, the sputter electrodes 4 being circumferentially spaced from one another, as shown in FIG. 2. Although the number of the sputter electrodes 4 shown in FIG. 2 is three, this number is suitably determined according to the number of layers to be deposited on a substrate 5.

For example, in the case where a three-layer film is to be formed on the substrate by depositing a first layer of the target material 3b on the surface of the substrate 5, and then by depositing a second layer of one target material 4b on the first layer, and finally by depositing another target material 4b on the second layer, the number of the electrode 3 is one, and the number of the electrodes 4 is two. In this case, these three electrodes are, of course, supported by their respective support members.

A substrate holding means comprises an angularly movable lever 10 which is supported through a bearing 8 on a bottom plate 2a of the vacuum housing and is operatively connected to a drive means 9 provided exteriorly of the vacuum housing 2, and a substrate holder 11 which is rotatable about the central axis A together with the angularly movable lever 10 and is also rotatable about an axis disposed on a circle (revolution orbit) $O_1$ encircling the central axis A and having its center disposed on the central axis A. The bearing 8 is disposed below the sputter electrode 3 and has its axis aligned with the central axis A. The substrate holder 11 is fixedly mounted on a rotatable shaft 13 for rotation therewith, and a substrate stage 12 is mounted on that portion of the substrate holder 11 disposed on a circle (revolution orbit) $O_2$ encircling the rotatable shaft 13 and having its center disposed on the axis of the rotatable shaft 13. The substrates 5 are held or supported on an outer peripheral or marginal portion of the substrate stage 12. Fixedly mounted on the lower end of the rotatable shaft 13 is a planetary gear 14 which is in mesh with a sun gear 15 fixedly mounted on a hollow shaft 19 rotatably supported by the bearing 8. The planetary gear 14 and the rotatable shaft 13 can revolve around the sun gear 15, and the substrate stage 12 can revolve around the rotatable shaft 13 through the substrate holder 11.

In this embodiment, although the plurality of substrates 5 are arranged on the outer peripheral portion of the substrate stage 12, only one substrate may be arranged on the central portion of the substrate stage 12.

Figure 5:
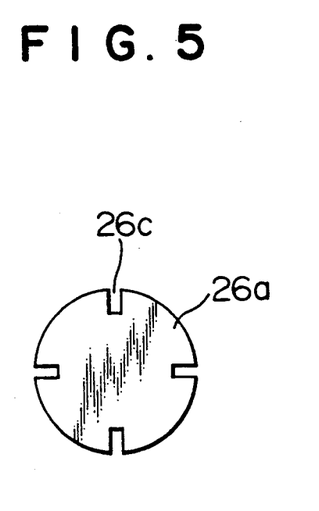
FIG. 5 is a plan view showing a disc of a detector provided in the embodiment shown in FIG. 1.

A suspension member 16 depends from the bottom plate 2a of the vacuum housing 2, and a motor 17 with a speed reducer as well as a clutch 18 is mounted on the suspension member 16. Fixedly mounted on a distal end of an output shaft 17a of the motor 17 is a bevel gear 20a which is in mesh with a bevel gear 20b which is fixedly mounted on the lower end of the hollow shaft 19. The hollow shaft 19 is rotatably supported by the bearing 8 fixedly secured to the outer surface (atmospheric side) of the bottom plate 2a, and the upper end portion of the hollow shaft 19 extends into the interior (vacuum chamber) of the vacuum housing 2. An angularly movable shaft 21, extending through the internal bore of the hollow shaft 19, is rotatably supported at its lower end portion by a bearing 23 fixedly secured to a lower surface of a bracket 22 fixedly secured to the suspension member 16. The angularly movable lever 10 is fixedly mounted on the upper end of the shaft 21. A bevel gear mechanism 20 comprising the bevel gears 20a and 20b is operatively connected to the clutch 18 via an input gearing 24 and an output gearing 25. The drive means 9 disposed below the vacuum housing 2 is constituted in this manner. A detector 26 is provided for detecting the rotation of the hollow shaft 19, and a detector 27 is provided for detecting the rotation of the angularly movable shaft 21 and hence the rotation of the angularly movable lever 10. Reference numeral 28 denotes a stopper. The detector 26 includes a disc 26a fitted on the hollow shaft 19 for rotation therewith and an optical sensor or a light sensor 26b mounted on the bearing 8. The disc is formed with slits as shown in FIG. 5. When each of the slits comes to a position registered with the optical sensor 26b according to the rotation of the hollow shaft 19, the optical sensor issues a signal for stopping the motor 17. The structure of the detector 27 is substantially identical with that of the sensor 26.

A substrate stage-rotating means 7 is provided below the vacuum housing 2 so as to rotate the substrate stage 12 about its axis when the substrate stage 12 is disposed in opposed relation to the sputter electrode 4 disposed at a position B lying on a circle encircling the sputter electrode 3 and having its center disposed on the axis of the sputter electrode 3. The substrate stage-rotating means 7 includes a motor 30 having a speed reducer and mounted on a tubular mounting portion 29 formed on the bottom plate 2a of the vacuum housing 2. A bearing portion 30a of the motor 30 extends into the interior of the vacuum housing 2, and an angularly movable shaft 32a for an arm 32 is mounted on the upper end of the bearing portion 30a, the arm 32 supporting a gearing 31. An output shaft 30b of the motor 30 rotatably extends through the internal bore of the bearing portion 30a, and a drive gear 31a is fixedly mounted on the distal end of the output shaft 30b. A drive friction wheel 34 is mounted on a driven gear 31b so as to rotate a driven friction wheel 33 fixedly mounted on an input shaft 12a of the substrate stage 12. The drive friction wheel 34 is fixedly mounted on the driven gear 31b for rotation therewith.

When a power cylinder 50 shown in FIG. 2 is driven so as to extend its associated rod 51, the arm 32 connected to the rod 51 is angularly moved about the shaft 32a in a direction of arrow a, so that the drive friction wheel 34 is pressed against the driven friction wheel 33. In this condition, when the drive friction wheel 34 is rotated by the motor 30 with the speed reducer, the driven friction wheel 33 is rotated so that the substrate stage 12 is rotated about its axis via the input shaft 12a. Thereafter, when the cylinder 50 is driven so as to angularly move the arm 32 into its initial position in a direction opposite to the arrow a, the substrate stage 12 can be moved to other position. Reference numeral 52 denotes a bellows. When the arm 32 is to be moved by driving the cylinder 50, the direction of the cylinder 50 is not always constant. In other words, the cylinder 50, while making a swinging motion, extends or retracts the rod 51 to angularly move the arm 32. Therefore, the bellows 52 is provided for allowing such swinging motion of the cylinder 50 and also for maintaining the interior of the vacuum housing 2 to vacuum.

The radius $R_2$ of revolution of the substrate stage 12 around the rotatable shaft 13, the radius $R_3$ of revolution of the substrate holder 11 about the central axis A, and the radius $R_1$ of the imaginary circle (having its center disposed on the axis of the sputter electrode 3 and hence on the central axis A) on which the axes of the sputter electrodes 4 are disposed are so determined as to satisfy the following conditions:

$$R_2 = R_3 \tag{1}$$

$$R_1 = R_2 + R_3 \tag{2}$$

The operation of the sputtering apparatus 1 of this embodiment will now be described. For rotating the substrate stage 12 about the central axis A, in the condition shown in FIGS. 1 and 2, the clutch 18 is engaged. In this condition, when the motor 17 with the speed reducer is driven, the sun gear 15 is rotated via the bevel gear mechanism 20 and the hollow shaft 19. In synchronism therewith, the angularly movable shaft 21 is rotated in the same direction via the bevel gear mechanism 20, the input gearing 24, the clutch 18 and the output gearing 25. The rotation of the angularly movable shaft 21 is transmitted to the angularly movable lever 10 connected to the shaft 21, so that the rotatable shaft 13 revolves around the central axis A. At this time, in response to the rotation of the sun gear 15, the planetary gear 14, together with the rotatable shaft 13, is revolving around the sun gear 15. As a result of this revolution of the rotatable shaft 13 about the central axis A, the substrate stage 12 rotates about the central axis A (and hence about the axis of the sputter electrode 3). Thus, the substrate holding means, comprising the angularly movable lever 10, the substrate holder 11 and so on, cooperates with the drive means 9 to constitute means for rotating the substrate stage 12 about the central axis A (that is, about its own axis) when the substrate stage 12 is disposed in opposed relation to the sputter electrode 3 having its axis aligned with the central axis A of the vacuum housing 2.

Next, for moving the substrate stage 12 to the sputter electrode 4 disposed at the position B on the circle coaxially encircling the central axis A, first, the angularly movable shaft 21 is fixed by the stopper 28, and the clutch 18 is disengaged. In this condition, when the motor 17 with the speed reducer is driven, the planetary gear 14 is rotated through the angular movement of the sun gear 15. However, since the angularly movable shaft 21 and the angularly movable lever 10 are held in the illustrated position, the planetary gear 14 does not revolve around the sun gear 15 but rotates about its axis. The rotation of the planetary gear 14 about its axis causes the rotatable shaft 13 to rotate, so that the substrate holder 11 rotates together with the rotatable shaft 13. As a result, the substrate stage 12 is moved such that its axis or centerline is disposed at the position B lying on the circle of the radius $R_1$ having its center disposed on the central axis A. The substrate holder 11 and the substrate stage 12 thus moved are indicated in phantom in FIG. 1. Thereafter, the fixing of the angularly movable shaft 21 by the stopper 28 is released, and the clutch 18 is engaged. In this condition, the motor 17 is driven to rotate the angularly movable lever 10 and the substrate holder 11 (which linearly extend from the rotatable shaft 13 in opposite directions) in unison, and when the substrate stage 12 is brought into a position where it is opposed to the sputter electrode 4, the detectors 26 and 27 detect this condition and cause the motor 17 to stop.

As will be appreciated from the foregoing, the substrate holding means, comprising the angularly movable lever 10, the substrate holder 11 and so on, cooperates with the drive means 9 to constitute the means for rotating the substrate stage 12 about its axis when the substrate stage 12 is disposed in opposed relation to the sputter electrode 3 (treatment source) having its axis disposed on the central axis A of the vacuum housing 2. Also, this substrate holding means cooperates with the drive means 9 to constitute means for moving the substrate stage 12 to the position B where the substrate stage 12 is disposed in opposed relation to the sputter electrode 4 (treatment source) having its axis or centerline disposed on the circle having its center aligned with the central axis A.

For rotating the substrate stage 12 about its axis when the substrate stage 14 is disposed in opposed relation to the sputter electrode 4, first, the motor 30 with the speed reducer is driven to rotate the drive friction wheel 34, and the arm 32 is angularly moved in the direction of the arrow a as shown in FIG. 2, so that the drive friction wheel 34 is pressed against the driven friction wheel 33 connected to the substrate stage 12, as indicated in phantom in FIG. 2, thereby rotating the substrate stage 12, disposed in opposed relation to the sputter electrode 4, about the axis thereof.

Although only one means (i.e., the cylinder and so on) for pressing the friction wheel 34 against the friction wheel 33 is shown in FIG. 2 in connection with the sputter electrode 4 disposed at the right-hand side (FIG. 2), a plurality of such pressing means are actually provided at respective positions corresponding respectively to the plurality of sputter electrodes 4. Also, a plurality of substrate stage-rotating means 7 are provided at respective positions corresponding respectively to the plurality of sputter electrodes 4. However, it is possible that the motor 30 as well as other part or parts is common to all the substrate stage-rotating means.

For depositing a plurality of films or layers on each substrate 5 using the sputtering apparatus 1 of the above embodiment, first, a film of the target material 3b is deposited on the surface of the substrate 5 when the substrate stage 12 is rotating about the central axis A in opposed relation to the sputter electrode 3. Then, the substrate stage 12 is moved to the position B so that the substrate stage 12 is disposed in opposed relation to one of the sputter electrodes 4, and a film of the target material 4b is deposited on the first film of the target material 3b on the substrate 5 while rotating the substrate stage 12. Then, the substrate stage 12 is moved to another position B so that the substrate stage 12 is disposed in opposed relation to another sputter electrode 4, and a film of another target material 4b is deposited on the second film of the target material 4b. Then, the substrate stage 12 is sequentially moved to the other positions B to deposit films of the other target materials 4b on the third film according to the same procedure, thereby forming the required multi-layer on the substrate 5.

The deposition of the films is thus carried out in this order. However, the order of the deposition is not limited to the foregoing, and the order of the depositions of the films can be changed suitably. Also, the number of the electrodes 4 as well as the number of the associated elements can be determined according to a desired layer to be formed on each substrate 5.

The embodiment of FIGS. 1 and 2 includes the hollow shaft 19 and the angularly movable shaft 21 arranged coaxially, so that the substrate holding mechanism mounted within the vacuum housing 2 can be driven by the drive means 9 mounted exteriorly of the vacuum housing 2. On the other hand, the embodiment of FIG. 3 includes shafts 19 and 21 extending into a vacuum housing 2 via bearings 8a and 8b disposed respectively on different axes.

Figure 3:
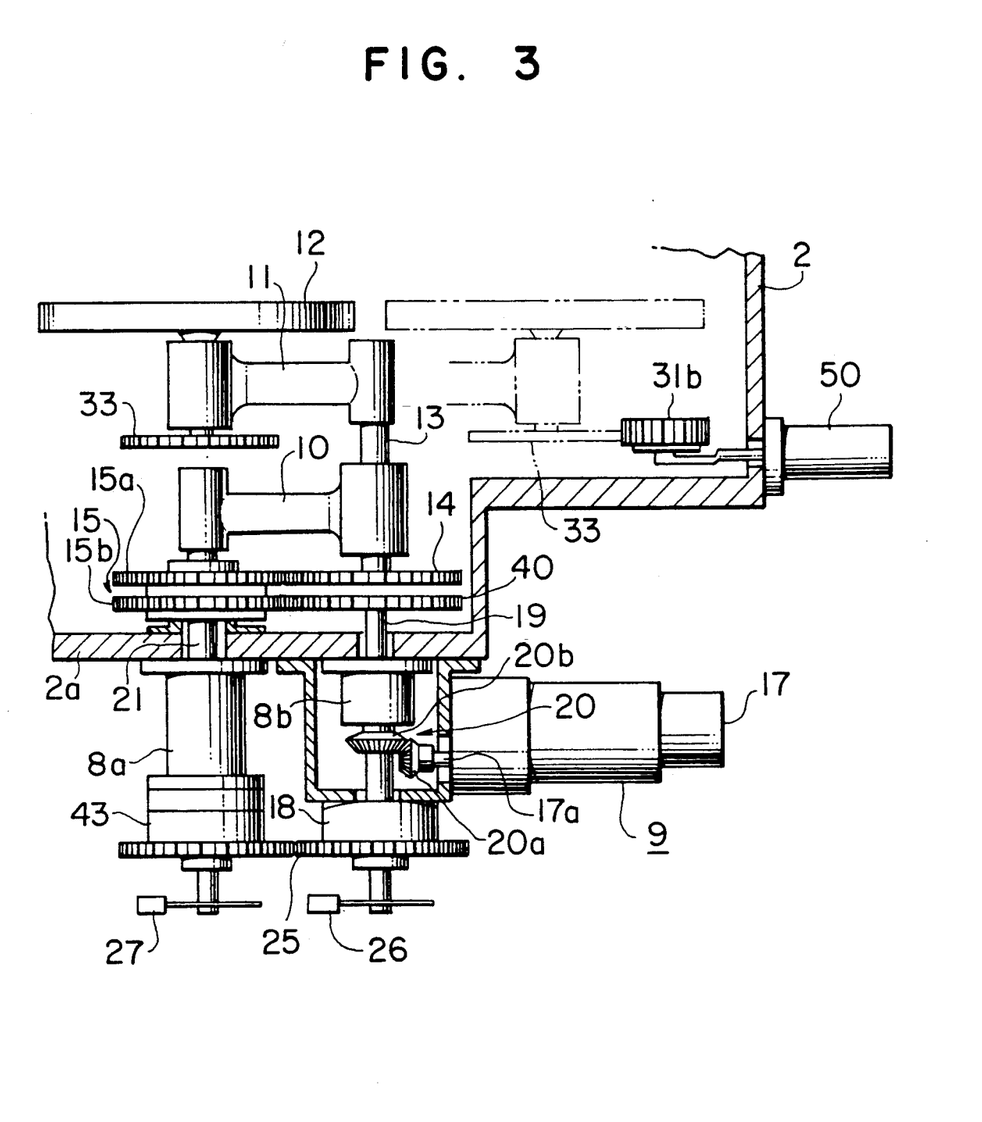
FIG. 3 is a vertical cross-sectional view of a vacuum treatment apparatus according to a second embodiment of the invention.

A bevel gear 20a, mounted on a distal end of an output shaft 17a of a motor 17 with a speed reducer, is in mesh with a bevel gear 20b mounted on one end of the shaft 19. The two bevel gears 20a and 20b constitute a bevel gear mechanism 20. The shaft 19 is connected to the shaft 21 via a clutch 18 and an output gearing 25. An angularly movable lever 10 is fittingly mounted on the upper end portion of the shaft 21 disposed within the vacuum housing 2. A pair of upper and lower gears 15a and 15b, constituting a sun gear 15, are integrally connected to each other in concentric relation to the shaft 21, and are supported on a bottom plate 2a of the vacuum housing 2. The two gears 15a and 15b are rotatable relative to the shaft 21. The lower gear 15b of the sun gear 15 is in mesh with a gear 40 fixedly mounted on the shaft 19, and the upper gear 15a is in mesh with a planetary gear 14 which is fixedly mounted on a rotatable shaft 13 and is rotatable relative to the angularly movable lever 10. A substrate stage 12 is rotatably supported on a substrate holder 11 fittingly mounted on the rotatable shaft 13.

The clutch 18 is engaged, and a brake 43 is released. In this condition, when the motor 17 is driven, the shaft 19 is rotated through the output shaft 17a and the bevel gear mechanism 20, so that the sun gear 15 is rotated via the gear 40. As a result, the planetary gear 14 in mesh with the upper gear 15a of the sun gear 15 rotates. At this time, in synchronism with the rotation of the shaft 19, the shaft 21 is rotated via the output gearing 25. Therefore, the planetary gear 14 revolves around the sun gear and rotates the substrate stage 12 about its axis.

The clutch engaged, and the brake 43 is operated. In this condition, when the motor 17 is driven, the shaft 19 is rotated together with the gear 40, so that the planetary gear 14 is rotated via the sun gear 15 in mesh with the gear 40, thereby rotating the rotatable shaft 13. Therefore, the substrate stage 12 is moved to a position indicated in phantom in FIG. 3. As in the embodiment of FIGS. 1 and 2, when a detector 26 detects the arrival of the substrate stage 12 at this position indicated in phantom, the motor 17 is stopped. This position indicated in phantom corresponds to the position B in FIG. 1. In this condition, a power cylinder 50 is operated, so that a gear 31b is brought into meshing engagement with a gear 33 fixed to the substrate stage 12. The gear 31b is rotated by a substrate stage-rotating means corresponds to the substrate stage-rotating means 7 of the first embodiment, so that the substrate stage 12 is rotated about its axis.

Thus, the vacuum treatment apparatus of the embodiment of FIG. 3 operates in a manner similar to that of the operation of the vacuum treatment apparatus of the embodiment of FIGS. 1 and 2, and can achieve substantially the same effects.

Figure 4:
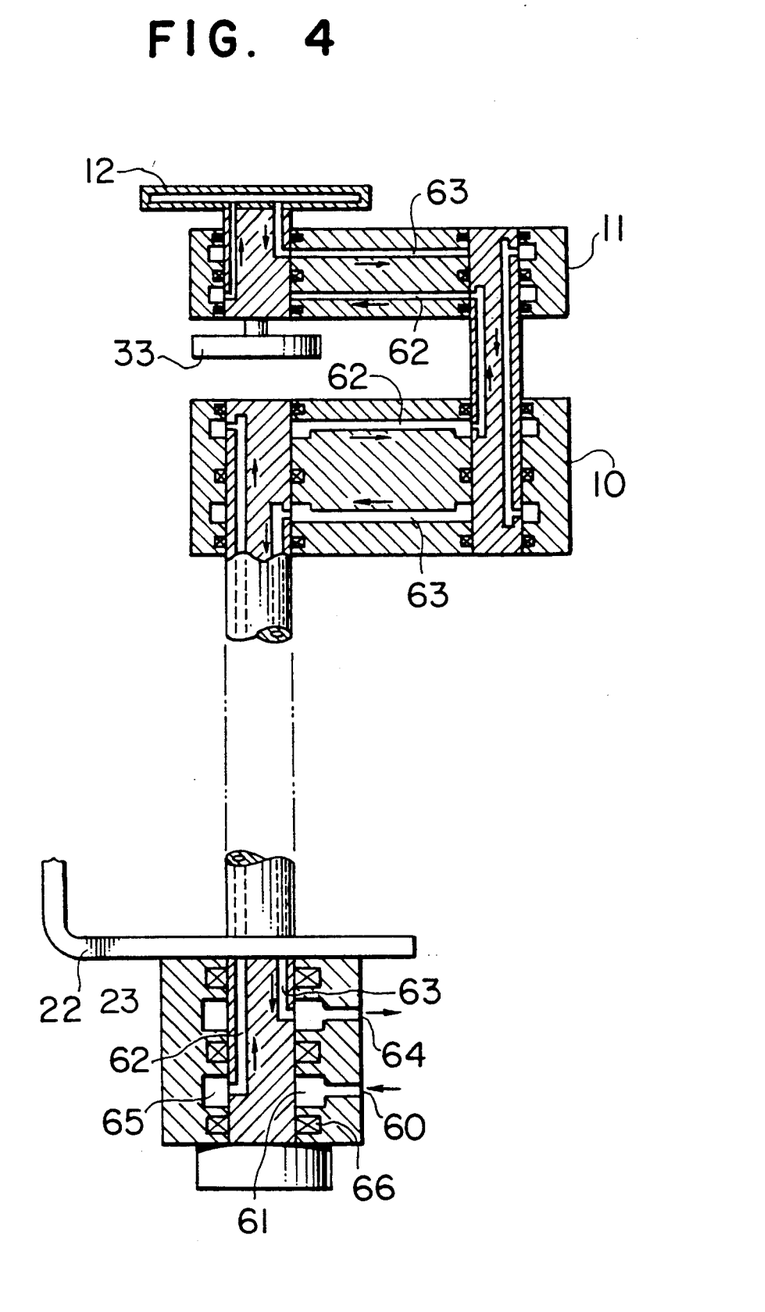
FIG. 4 shows one example of a substrate cooling means which may be adopted in the first embodiment.

In the embodiments of FIGS. 1-3, when the substrate stage 12 is to be returned from the position where the substrate stage 12 is opposed to the sputter electrode 4 to the position where the substrate stage 12 is opposed to the sputter electrode 3, the operation of the drive means is resumed, and the motor 17 is again operated. Each of the shafts 19 and 21 is always rotated in one direction. Therefore, a seal ring in the form of an O-ring (not shown), which is mounted between the shaft 19 (21) and its mating bearing 8b (8a) to keep the interior of the vacuum housing to vacuum, can has a longer lifetime, as compared with the case where each shaft 19 (21) is designed to effect reciprocating rotation. Therefore, the interior of the vacuum housing 2 can be maintained at a vacuum for a longer period of time. Where it is required to maintain the substrates 5 at a predetermined temperature during the treatment of the substrates, a substrate cooling means is provided for supplying a cooling medium to the substrate stage 12. One example of such substrate cooling means is shown in FIG. 4. This substrate cooling means includes a cooling water inlet port 60 and a cooling water outlet port 64 both of which are formed in the bearing 23, a cooling water supply passage 62 extending from the inlet port 60 to the substrate stage 12 via the bearing 23, the shaft 21, the angularly movable lever 10, the rotatable shaft 13 and the substrate holder 11, and a cooling water return passage 63 extending from the substrate stage 12 to the outlet 64 via the substrate holder 11, the rotatable shaft 13, the angularly movable lever 10, the shaft 21 and the bearing 23. In FIG. 1, reference numeral 65 denotes a water chamber, and reference numeral 66 denotes a sealing material.

Although the vacuum treatment apparatus of embodiments of FIGS. 1-3 is constituted as a sputtering apparatus, the present invention is also applicable to other vacuum treatment apparatuses such, for example, as an etching apparatus and a chemical vapor deposition apparatus. Further, in the embodiments of FIGS. 1-3, although the plurality of sputter electrodes 4 are disposed on the circle having its center disposed on the central axis A of the vacuum housing 2, the number of the sputter electrodes 4 may be one.

What is claimed is:

1. A vacuum treatment apparatus comprising:
   a vacuum housing defining a vacuum chamber and having a first treatment position and a plurality of second treatment positions disposed on a circle surrounding said first treatment position in a spaced relationship from each other, said first treatment position being disposed substantially in a center of said circle;
   a substrate stage provided within said vacuum chamber so as to support at least one substrate thereon;
   holding means for holding said substrate stage in a manner to make it movable between said first treatment position and at least one of said second treatment positions and between said second treatment positions, said holding means being operable to rotate said substrate stage about an axis of said substrate stage when said substrate stage is disposed at said first treatment position;
   drive means operatively connected to said holding means for driving the same so that said holding means can move said substrate stage between said first and said at least one second treatment position and between said second treatment positions, said drive means being operable to drive said holding means so that said holding means can rotate said substrate stage about the axis thereof at said first treatment position; and
   means for rotating said substrate stage about the axis thereof when said substrate stage is disposed at each of said second treatment positions.

2. Apparatus according to claim 1, further comprising means for cooling said substrate stage and said substrate supported on said substrate stage.

3. A vacuum treating apparatus comprising:
   a vacuum housing defining a vacuum chamber and having a first treatment position within said vacuum chamber and at least one second treatment positions disposed on a circle surrounding said first treatment position in a within said vacuum chamber and spaced relationship from said first treatment position;
   a substrate stage provided within said vacuum chamber so as to support at least one substrate thereon;

holding means for holding said substrate stage in a manner to make it movable between said first treatment position and said second treatment position, said holding means being operable to rotate said substrate stage about an axis of said substrate stage when said substrate stage is disposed at said first treatment position;

said holding means comprises a rotatable shaft disposed intermediate said first and second treatment positions, a substrate holder supporting said substrate stage at one end thereof and fixedly mounted at the other end thereof on said rotatable shaft, and an angularly movable lever disposed below said substrate holder and rotatably fitted at one end on said rotatable shaft, the other end of said angularly movable lever being disposed generally in registry with said first treatment position;

drive means operatively connected to said holding means for driving the same so that said holding means can move said substrate stage between said first and second treatment positions, said drive means being operable to drive said holding means so that said holding means can rotate said substrate stage about the axis thereof at said first treatment position, said drive means comprising a first hollow drive shaft having an upper end and a lower end, a second drive shaft having an upper end and a lower end, and a planetary gear mechanism including a sun gear fixedly mounted on an upper end of said first drive shaft, and a planetary gear fixedly fitted on a lower end of said rotatable shaft and meshingly engaging said sun gear, said second drive shaft extending through an internal bore of said first drive shaft and further through said sun gear and being fixedly secured at the upper end to the upper end of said angularly movable lever, said first drive shaft and said second drive shaft being adapted to be rotated at a predetermined timing so as to effect the movement of said substrate stage between said first and second treatment position as well as the rotation of said substrate stage about its axis at said first treatment position; and means for rotating said substrate stage about the axis thereof when said substrate stage is disposed at said second treatment position.

4. Apparatus according to claim 3, in which said first drive shaft is rotatable in one direction, and said second drive shaft is rotatable in one direction.

5. An apparatus according to claim 3, wherein communicating coolant supply and return passage means for provided in said rotatable shaft, said substrate holder, said angularly movable lever and said second drive shaft, said supply and return coolant passage means communicating said substrate stage with a coolant supply so as to enable a coolant flow and return of coolant from the coolant supply to the substrate stage.

6. Apparatus according to claim 5, wherein bearing means are provided for rotatably supporting the lower end of said second drive shaft, and wherein said bearing means includes coolant inlet port means communicating with the coolant supply passage means and coolant return passage means for communicating with the coolant return passage means so as to enable the coolant flow through the cooling means.

7. A vacuum treatment apparatus comprising:
a vacuum housing defining a vacuum chamber and having a first treatment position within said vacuum chamber and at least one second treatment positions disposed within said vacuum chamber and spaced said first treatment position;

a substrate stage provided within said vacuum chamber so as to support at least one substrate thereon;

holding means for holding said substrate stage in a manner to make it movable between said first treatment position and said second treatment position, said holding means being operable to rotate said substrate stage about an axis of said substrate stage when said substrate stage is disposed at said first treatment position;

said holding means comprises a rotatable shaft disposed intermediate said first and second treatment positions, a substrate holder supporting said substrate stage at one end thereof and fixedly mounted at the other end thereof on said rotatable shaft, and an angularly movable lever disposed below said substrate holder and fitted at one end on said rotatable shaft in a manner to allow a relative rotation therebetween, the other end of said angularly movable lever being disposed generally in registry with said first treatment position;

drive means operatively connected to said holding means for driving the same sot hat said holding means can move said substrate stage between said first and second treatment positions, said drive means being operable to drive said holding means so that said holding means can rotate said substrate stage about the axis thereof at said first treatment position, said drive means comprising a first drive shaft fixedly secured at an upper end thereof to said angularly movable lever, a second drive shaft extending in parallel relation to said first drive shaft, and a planetary gear mechanism including a sun gear rotatably fitted on said first drive shaft, and having a pair of integrally connected upper and lower gears, and a planetary gear fixedly mounted on a lower end of said rotatable shaft and having a pair of upper and lower gears respectively in mesh with said upper and lower gears of said sun gear, said second drive shaft being fixedly secured at an upper end thereof to said lower gear of said planetary gear, said first drive shaft and said second rive shaft being adapted to be rotated at a predetermined timing so as to effect the movement of said substrate stage between said first and second treatment position as well as the rotation of said substrate stage about is axis at said first treatment position; and means for rotating said substrate stage about the axis thereof when said substrate stage is disposed at said second treatment position.

8. Apparatus according to claim 7, in which said first drive shaft is rotatable in one direction, and said second drive shaft is rotatable in one direction.

9. A vacuum treatment method comprising the steps of:
preparing a vacuum treatment apparatus including a vacuum housing defining chamber, said vacuum chamber having a first treatment position and a plurality of second treatment positions disposed on a circle surrounding said first treatment position in a spaced relationship from each other, said first treatment position being disposed substantially at a center of said circle;

positioning a substrate stage, supporting a substrate thereon, at a first treatment position, and depositing a first film on said substrate while rotating said substrate stage about an axis thereof;

rotating said substrate stage about an axis disposed intermediate said first treatment position and one of said second treatment positions, so as to move said substrate stage as well as said substrate into said one second treatment position, and depositing a second film on said first film formed on said substrate, while rotating said substrate stage about the axis thereof at said one second treatment position; and rotating said substrate stage about an axis disposed at the center of said circle, so as to move said substrate stage as well as said substrate into another of said second treatment positions, and depositing a third film on said second film formed on said substrate, while rotating said substrate stage about the axis thereof at said another second treatment position.

10. A vacuum treatment method comprising the steps of:

preparing a vacuum treatment apparatus including a vacuum housing defining chamber, said vacuum chamber having treatment positions said treatment positions including a plurality of treatment positions disposed on a circle in a spaced relationship from each other and one treatment position disposed substantially at a center of said circle;

positioning a substrate stage, supporting a substrate thereon, at a first one of said treatment positions, and depositing a first film on said substrate while rotating said substrate stage about an axis thereof;

moving said substrate stage and said substrate into a second one of said treatment positions, and depositing a second film on said first film formed on said substrate, while rotating said substrate stage about the axis thereof at said second one of said treatment positions; and moving said substrate stage as well as said substrate into a third one of said treatment positions, and depositing a third film on said second film formed on said substrate, while rotating said substrate stage about the axis thereof at said third one of said treatment position, wherein said first, second and third treatment positions include said treatment positions disposed substantially at the center of said circle.

* * * * *